Figure 1:
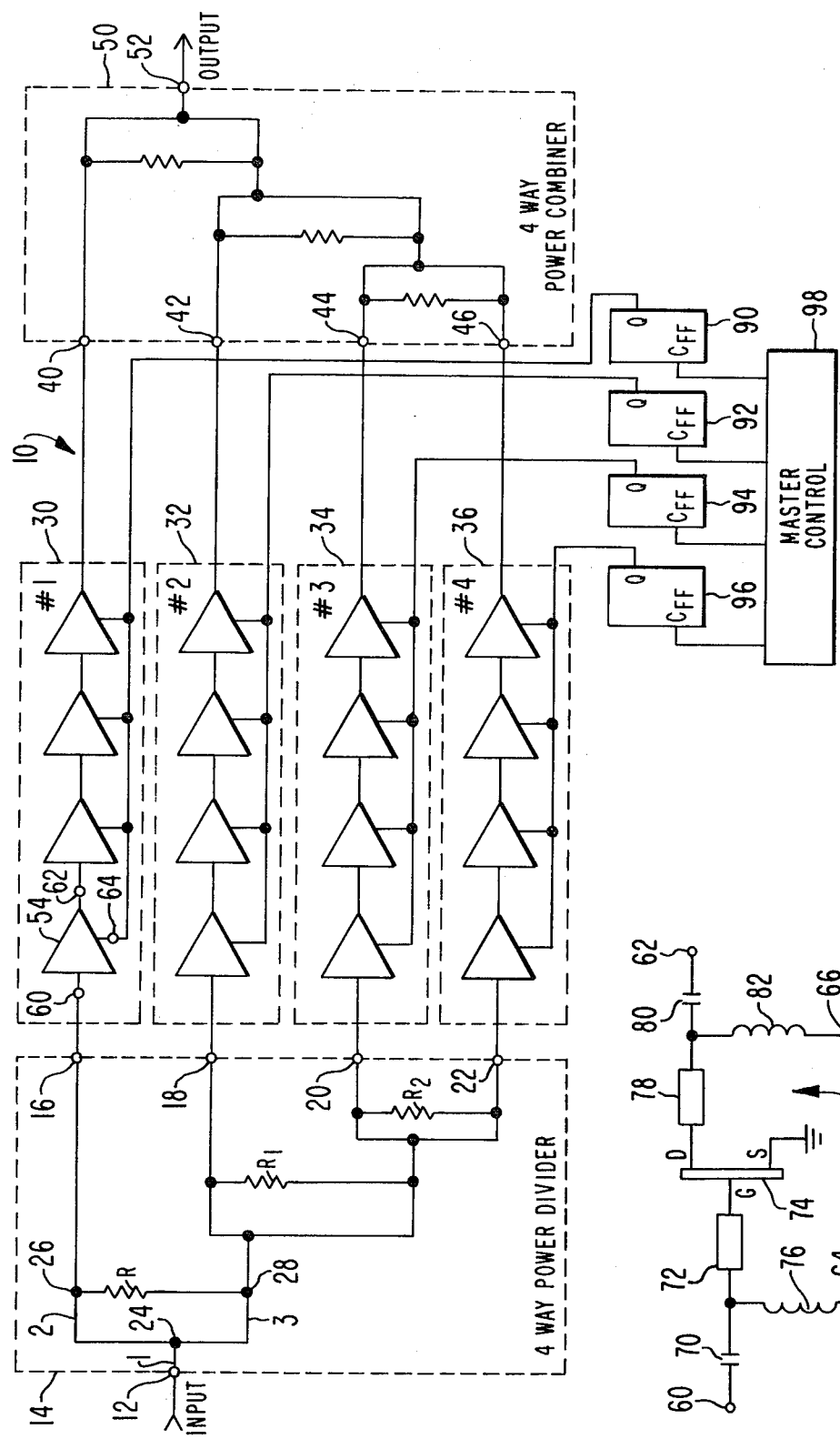

United States Patent [19]

Kumar et al.

[11] 4,439,744
[45] Mar. 27, 1984

[54] VARIABLE POWER AMPLIFIER

[75] Inventors: Mahesh Kumar, South Brunswick Township, Middlesex County; Lakshminarasimha C. Upadhyayula, East Windsor, both of N.J.

[73] Assignee: RCA Corporation, New York, N.Y.

[21] Appl. No.: 334,258

[22] Filed: Dec. 24, 1981

[51] Int. Cl.³ .......................... H03F 3/60; H03G 3/20
[52] U.S. Cl. .................................. 330/285; 330/277; 330/286; 330/295
[58] Field of Search ................. 330/53, 124 R, 124 D, 330/277, 285, 286, 287, 295, 296

[56] References Cited

U.S. PATENT DOCUMENTS 4,311,965  1/1982  Jones ................................. 330/295 X

FOREIGN PATENT DOCUMENTS 2355512  5/1975  Fed. Rep. of Germany ...... 330/295
54-107249 8/1979  Japan .................................... 330/295

Primary Examiner—James B. Mullins
Attorney, Agent, or Firm—J. S. Tripoli; R. L. Troike; R. E. Smiley

[57] ABSTRACT

A plurality of FET or other amplifiers are connected between respective outputs of an N output port power divider network and respective inputs of an N input power combining network in a variable power amplifier system. A gate bias is selectively supplied to each of the amplifiers which is either at a first value to cause the amplifier to amplify or at a second value to cause the amplifier to be cut off and therefore to not dissipate any DC power. The number of amplifiers receiving the first potential is determinative of the amount of power amplification of the variable power amplifier.

5 Claims, 2 Drawing Figures

VARIABLE POWER AMPLIFIER

This invention relates to variable power amplifiers and more particularly to such amplifiers having power varied in discrete steps while maximizing efficiency at all power levels.

There are a number of systems which require an amplifier capable of selectable output power levels, particularly at gigahertz frequencies. A number of schemes are known for achieving this result. One such scheme is to utilize an FET amplifier. The variable output power is achieved by varying the radio frequency (RF) input power level to the power stage of the variable power amplifier. The input power to the power stage is, in turn, varied typically by a dual-gate FET amplifier used in the pre-amplifier stage of the variable power amplifier. Such an FET amplifier has the undesirable property of having a phase which varies substantially with different power levels. A second scheme also involving an FET amplifier is to switch the drain voltage proportional to the output power. This scheme suffers from having to switch large currents and also has the aformentioned phase problem.

It is known to achieve a relatively high-power amplifier system using relatively low-power FET amplifiers by putting several such amplifiers in parallel between a power divider at the input and a power combiner at the output. Such individual amplifiers are subject to failure either by open circuit or short circuit. Studies have been performed to determine what problems occur when one or more of the amplifiers fail. The results of two such studies have been reported by R. L. Ernst, R. L. Camisa and A. Presser, "Graceful Degradation Properties of Matched N-Port Power Amplifier Combiners," 1977 IEEE MTT-S International Microwave Symposium Digest, June 1977, pp. 174–177 and A. A. M. Saleh, "Improving the Graceful-Degradation Performance of Combined Power Amplifiers," IEEE Trans. Microwave Theory Tech., MTT-28, 1068 (1980). Such studies have not been concerned with power efficiency under variable output power conditions and of course are not concerned with any problems in turning off and on an individual amplifier.

By contrast, the instant invention is concerned with an amplifier system which consumes a minimum power whether operating under low-power conditions or high-power conditions. Further, amplifiers have to be able to be turned on as well as off in a relatively short time.

Therefore, in accordance with the invention, a variable power amplifier system comprises in combination a plurality of amplifiers connected to respective output ports of a power divider at the input end and respective input ports of a power combiner at the output end. Each of the amplifiers comprises an active device having a terminal to which a signal is coupled from one port of the power divider and to which is supplied DC bias. A logic means selectively supplies a first or second DC bias potential to the gate terminal, the first potential being of such value to cause the active device to amplify, the second potential being below the cut off voltage of the amplifier for causing the amplifier to produce no signal and consume no power.

Figure 2:
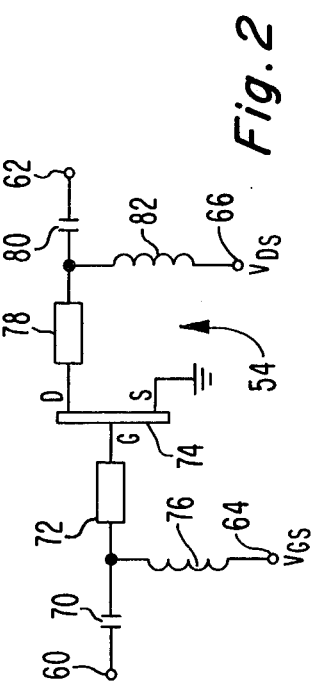

In the drawings:

FIG. 1 is a preferred embodiment in block and schematic form of an exemplary variable power amplifier system capable of producing four different levels of power output; and FIG. 2 is an exemplary switchable amplifier used in the variable power amplifier system of FIG. 1.

FIG. 1, to which attention is now directed, illustrates an exemplary variable power amplifier system (VPA) 10 capable of selectively producing any of four different output power levels. In one exemplary VPA, which will be described in connection with FIG. 1, the output levels are 500 milliwatts, 163 milliwatts, 55 milliwatts and 16.5 milliwatts, respectively, with an input of 5 milliwatts. The principals to be described hereinafter are applicable to VPAs which are capable of producing more or fewer different output power levels.

An input alternating signal, from a signal source (not shown), which may be in the gigahertz range, is applied to input port 12 of an in-phase type power divider 14 which has four output ports 16, 18, 20 and 22 producing different power levels. Parad et al. (L. I. Parad and R. L. Moynhan, "Split-Tee Power Divider," IEEE Trans. Vol. MTT-10, 91, (1965)) has described a two-way power divider with unequal power outputs at its two output ports. Assuming a two-way power divider having an input arm 1 and output arms 2 and 3 all joined at junction 24 with a resistor connected between the output arms, as illustrated within block 14, and further assuming that the two arms from junction 24 to resistor R are one-quarter wavelength:

$$Z_2 = Z_1(K(1+K^2))^{.5} \qquad (1)$$

$$Z_3 = Z_1((1+K^2)/K^3)^{.5} \qquad (2)$$

$$R = Z_1((1+K^2)/K) \qquad (3)$$

where $K^2 =$ (power through arm 3)/(power through arm 2,), $Z_1$ is the impedance of the input signal source, which is normally 50 ohms, $Z_2$ is the impedance from junction 24 to the junction 26 with resistor R of arm 2 and $Z_3$ is the impedance from junction 24 to the junction 28 with resistor R of arm 3. The impedance of other parts of power divider 14 are computed similarly. In an exemplary VPA the outputs of the four ports 16, 18, 20 and 22 have power divisions of $-2.22$ dB, $-6.99$ dB, $-10$ dB and $-10$ dB, respectively. Thus, for the exemplary VPA, input power at input port 12 of 5 milliwatts results in an output power at ports 16, 18, 20 and 22 of 3.0 milliwatts, 1.0 milliwatts, 0.5 milliwatts and 0.5 milliwatts, respectively. The electrical length from the input port 12 to each of the output ports is identical.

In-phase power divider 14 is not to be confused with another type of divider called a hybrid in which phase shifting occurs within the power divider.

Port 16 of power divider 14 is coupled to a first amplifier chain within dashed box 30. Similarly, ports 18, 20 and 22 are coupled to second, third and fourth amplifier chains within dashed blocks 32, 34 and 36, respectively. The outputs of the four amplifier chains are coupled to respective input ports 40, 42, 44 and 46 of a four-way power combiner illustrated within dashed block 50. Power combiner 50 is identical to power divider 14 and has identically valued parts thereof. Power combiner 50 has an output port 52 at which is produced an output signal of a desired power level. In the exemplary embodiment hereinbefore described, the output power levels are 500 milliwatts, 163 milliwatts, 55 milliwatts and 16.5 milliwatts, respectively.

Each of the four amplifier chains 30, 32, 34 and 36 comprises four series-connected power amplifiers such as the field effect transistor (FET) amplifiers illustrated by four triangles such as 54. Each of the amplifiers may be similar to the one illustrated in FIG. 2, to which attention is now directed. Each amplifier has a signal input terminal 60, a signal output terminal 62, a gate DC potential terminal 64 and a drain DC potential terminal 66. Input terminal 60 is series-connected with a DC blocking capacitor 70 and a suitable impedance matching network 72 to the gate (G) of an FET power amplifying transistor 74. Terminal 64 is coupled through a choke 76 to the juncture of capacitor 70 and matching network 72. The source (S) of transistor 74 is connected to circuit ground while the drain (D) is series-connected through an output impedance matching network 78 and output blocking capacitor 80 to output terminal 62. Capacitor 80 also serves as the input blocking capacitor for the following stage. Drain bias potential terminal 66 is connected through choke 82 to the juncture of matching network 78 and blocking capacitor 80.

In accordance with the invention, there is supplied to gate bias terminal 64 one of two potentials. One potential approximately −1 volt causes the amplifier to amplify. The second voltage provides a pinch-off voltage to amplifier 74 such as to stop or substantially stop the flow of electrons from the source to the drain thereof whereby the amplifier consumes no DC power or substantially no DC power. This voltage is for a typical FET transistor approximately −6 to −8 volts DC. With the potential supplied to terminal 64 at the pinch-off value, no current flows within transistor 74. In general, with any type amplifying device, the second voltage causes the amplifier to be cutoff such that it passes no signal and consumes no DC power.

The efficiency of an amplifier, either of an individual amplifier such as illustrated in FIG. 2 or of an amplifier chain such as any of chains 1, 2, 3, 4 of FIG. 1 or the entire system of FIG. 1 is as follows:

$$\eta = (P_{rf,out} - P_{rf,in})/(P_{dc,in} + P_{logic,in}) \quad (4)$$

where $P_{rf,out}$ is the rf power output, $P_{rf,in}$ is the rf input power, $P_{dc,in}$ is DC power input and $P_{logic,in}$ is the logic signal power input of a logic circuit to be hereinafter described which supplies the potential to terminal 64.

Returning to FIG. 1, the gate bias inputs of all of the amplifiers in an amplifier chain are connected to an associated logic circuit such as a flip-flop. Thus, both voltages of the amplifiers in amplifier chain 30 are controlled by the state of flip-flop 90. Similarly, the gate biases of the amplifiers in amplifier chains 32, 34 and 36 are controlled by flip-flops 92, 94 and 96, respectively. A master control logic 98 is connected to each of flip-flops 90, 92, 94 and 96 to control the states thereof. For example, with flip-flop 90 in one state, a potential is applied to each of the amplifiers in amplifier chain 1 to cause amplification. With flip-flop 90 in the other state, potential is supplied to each of the amplifiers in amplifier chain 1 to cause the associated transistor to be pinched off such that the amplifiers produce substantially no output power and, thus, no output power is supplied to port 40 of four-way power combiner 50. It will be realized that it is not essential that there be four amplifiers provided in each amplifier chain. Due to the required power transfer of amplifier chain 1, in one particular embodiment, with an input power of 3 milliwatts and a desired output power of 300 milliwatts and given the power capacity available of FETs, four FET amplifiers are required. However, the other amplifier chains are required to pass less power and, therefore, could utilize a fewer number such as 3, 2 or 1, of transistors of relatively large power handling capability or a greater number of transistors of relatively low power handling capability. The latter route was chosen in the exemplary embodiment illustrated in FIG. 1. This latter arrangement has the advantage of easily providing for the same electrical path length through each of the four amplifier chains.

In operation, an input signal of a desired frequency and power level is supplied at input port 12 of VPA 10. If all logic devices 90, 92, 94 and 96 are producing output potentials at the first value such that all amplifiers in all amplifier chains are amplifying, VPA 10 produces its maximum output power, which may be, by way of example, 500 milliwatts, at output port 52.

When it is desired to have a lower power amplification, respective ones of flip-flops 90, 92, 94 and 96 are caused to change their state to pinch-off the FET amplifier or amplifiers in one or more of the amplifier chains. Since, as mentioned in connection with the description of FIG. 2, when an amplifier chain is cut-off there is no current flow, the total efficiency of this system remains relatively high. Thus, utilizing equation (4) with all four amplifier chains operational $P_{rf,in}$ is, as previously mentioned, 5 milliwatts, $P_{rf,out}$ is, as previously mentioned, 500 milliwatts, the DC power-in, with all amplifiers operational, is 3,160 milliwatts and the logic power is typically 10–20 milliwatts. Therefore, utilizing equation (4), the efficiency is 15.6%. With amplifier chain No. 1 cut off, the input power remains at 5 milliwatts, the output power is 163 milliwatts, as abovementioned, the DC input power is 1,174 milliwatts and the logic is, as above mentioned, 10 milliwatts. Therefore, in accordance with equation (4), the efficiency is 13.2%. Similarly, with amplifier chains 1 and 2 cutoff by proper choice of state of flip-flops 90 and 92, efficiency is 9.25% and with the three chains 1, 2 and 3 cut off, the efficiency is still 4%. The relatively high efficiency maintained with various amplifier chains cutoff is possible because when the gate voltage is at pinch-off value, there is no current flow in a given FET and, therefore, the power dissipation is essentially 0. The logic circuits 90, 92, 94 and 96 draw a very minimal current, in the example above-given only 10 milliwatts, which is essentially insignificant.

It will be realized that there are some losses in the power combiner when less than all amplifier chains are operational. Therefore, by way of example, for the exemplary system of FIG. 1 with amplifier chain No. 1 (block 30) off, the total power available at the output of amplifier chains 2, 3 and 4 is 200 milliwatts while the system output power is 163 milliwatts, as described in A. A. M. Saleh, "Improving the Graceful-Degradation Performance of Combined Power Amplifiers," IEEE Trans. Microwave Theory Tech., MTT-28, 1068 (1980).

In the exemplary system it is desired to produce only four different power levels so the amplifier chains are cutoff or added as indicated above. It is possible to cutoff the amplifier chains in any order and, thus, have 15 different power levels present with various combinations of amplifier chains cutoff.

What is claimed is:
1. A variable power amplifier system comprising, in combination:

an in-phase power divider network having an input port for receiving thereat an alternating signal to be amplified in power and having N output ports;

an in-phase power combining network having N input ports and one output port;

N signal amplifier means coupled to respective ones of said N output ports to receive said alternating signal therefrom to be amplified and coupled to respective ones of said N input ports to provide amplified signals thereto;

each of said amplifiers comprising an active device having a terminal coupled to receive said alternating signal and also adapted to receive a bias potential thereat; and logic means coupled to each said terminal for selectively supplying either a first or a second bias potential thereto, said first potential being of such value as to cause said device to amplify, said second potential being of such value as to cause said device to be cut off to thereby provide no output signal and consume no power;

whereby the power supplied to said output port of said power combining network is a function of which amplifiers are at said first bias potential and which are at said second bias potential.

2. The combination as set forth in claim 1 wherein said power divider network is adapted to produce unequal values of power at respective ones of its N output ports.

3. The combination as set forth in either claim 1 or claim 2 wherein said amplifier means for at least one port comprises a plurality of series-connected amplifiers, each such amplifier comprising an FET having a gate terminal and wherein said logic means supplies to all said gate terminals for all the amplifiers of said one port amplifier means either said first potential or said second potential.

4. The combination as set forth in claim 1 or claim 2 wherein the electrical length from the input port of said power divider network to the N output ports thereof are identical.

5. The combination as set forth in claim 4 wherein said power combining network is identical in configuration to said power divider network.

* * * * *